United States Patent
Demir et al.

(10) Patent No.: US 10,490,967 B2
(45) Date of Patent: *Nov. 26, 2019

(54) BIDIRECTIONAL LONG CAVITY SEMICONDUCTOR LASER FOR IMPROVED POWER AND EFFICIENCY

(71) Applicant: Lumentum Operations LLC, Milpitas, CA (US)

(72) Inventors: Abdullah Demir, San Jose, CA (US); Matthew Glenn Peters, Menlo Park, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/282,284

(22) Filed: Sep. 30, 2016

(65) Prior Publication Data

US 2017/0093125 A1 Mar. 30, 2017

Related U.S. Application Data

(63) Continuation of application No. 14/139,290, filed on Dec. 23, 2013, now Pat. No. 9,647,416.

(51) Int. Cl.
*H01S 3/10* (2006.01)
*H01S 5/022* (2006.01)
(Continued)

(52) U.S. Cl.
CPC ........ *H01S 3/10061* (2013.01); *H01S 5/0071* (2013.01); *H01S 5/028* (2013.01);
(Continued)

(58) Field of Classification Search
CPC .... H01S 5/1039; H01S 5/4075; H01S 5/4056; H01S 5/4043; H01S 5/223; H01S 5/0287; H01S 5/4012
See application file for complete search history.

(56) References Cited

U.S. PATENT DOCUMENTS 4,828,357 A 5/1989 Arata et al.
4,978,197 A 12/1990 Horikawa
(Continued)

OTHER PUBLICATIONS

A. Guermache et al: "Experimental Demonstration of Spatial Hole Burning Reduction Leading to 1480-nm Pump Lasers Output Power Improvement", IEEE Photonics Technology Letters, 2005, 17 (10), pp. 2023-2025.

(Continued)

*Primary Examiner* — Xinning(Tom) Niu
(74) *Attorney, Agent, or Firm* — Harrity & Harrity, LLP

(57) ABSTRACT

The invention relates to bi-directional long-cavity semiconductor lasers for high power applications having two AR coated facets (2AR) to provide an un-folded cavity with enhanced output power. The lasers exhibit more uniform photon and carrier density distributions along the cavity than conventional uni-directional high-power lasers, enabling longer lasers with greater output power and lasing efficiency due to reduced longitudinal hole burning. Optical sources are further provided wherein radiation from both facets of several 2AR lasers that are disposed at vertically offset levels is combined into a single composite beam.

20 Claims, 9 Drawing Sheets

(51) Int. Cl.
*H01S 5/028* (2006.01)
*H01S 5/223* (2006.01)
*H01S 5/00* (2006.01)
*H01S 5/10* (2006.01)
*H01S 5/40* (2006.01)
*H01S 5/22* (2006.01)

(52) U.S. Cl.
CPC ........ *H01S 5/0287* (2013.01); *H01S 5/02236* (2013.01); *H01S 5/1039* (2013.01); *H01S 5/223* (2013.01); *H01S 5/4012* (2013.01); *H01S 5/4043* (2013.01); *H01S 5/4056* (2013.01); *H01S 5/4075* (2013.01); *H01S 5/22* (2013.01); *H01S 5/4025* (2013.01)

(56) References Cited

U.S. PATENT DOCUMENTS

| | | | |
|---|---|---|---|
| 4,986,634 A | 1/1991 | Horikawa et al. | |
| 5,048,911 A | 9/1991 | Sang et al. | |
| 5,138,491 A | 8/1992 | Horikawa et al. | |
| 5,185,758 A | 2/1993 | Fan et al. | |
| 5,216,544 A | 6/1993 | Horikawa et al. | |
| 5,268,978 A | 12/1993 | Po et al. | |
| 5,319,528 A | 6/1994 | Raven | |
| 5,631,916 A * | 5/1997 | Georges | H01S 5/06213 372/26 |
| 5,933,278 A | 8/1999 | Plummer et al. | |
| 6,005,717 A | 12/1999 | Neuberger et al. | |
| 6,044,096 A | 3/2000 | Wolak et al. | |
| 6,124,973 A | 9/2000 | Du et al. | |
| 6,151,168 A | 11/2000 | Goering et al. | |
| 6,494,371 B1 | 12/2002 | Rekow et al. | |
| 6,898,222 B2 | 5/2005 | Henning et al. | |
| 7,006,549 B2 | 2/2006 | Anikitchev et al. | |
| 7,376,296 B2 | 5/2008 | Goncharov et al. | |
| 7,586,963 B2 | 9/2009 | Schulte et al. | |
| 7,668,214 B2 | 2/2010 | Wilson et al. | |
| 8,427,749 B2 | 4/2013 | Du et al. | |
| 9,647,416 B2 * | 5/2017 | Demir | H01S 3/10061 |
| 2002/0051360 A1 | 5/2002 | Solodovnikov et al. | |
| 2003/0132451 A1* | 7/2003 | Huang | B82Y 20/00 257/191 |
| 2004/0218644 A1* | 11/2004 | Lin | H01S 5/10 372/43.01 |
| 2006/0216842 A1* | 9/2006 | Charache | B82Y 20/00 438/28 |
| 2007/0116077 A1 | 5/2007 | Farmer et al. | |
| 2007/0195850 A1 | 8/2007 | Schluter et al. | |
| 2008/0063017 A1 | 3/2008 | Schnitzler et al. | |
| 2008/0198893 A1 | 8/2008 | Bartoschewski et al. | |
| 2008/0310027 A1 | 12/2008 | Wilson et al. | |
| 2009/0028197 A1* | 1/2009 | Arnone | B82Y 20/00 372/32 |
| 2009/0097511 A1* | 4/2009 | Mohrdiek | H01S 5/146 372/21 |
| 2009/0245315 A1 | 10/2009 | Faybishenko | |
| 2009/0323752 A1 | 12/2009 | Chuyanov et al. | |
| 2012/0002293 A1* | 1/2012 | Du | H01S 5/4012 359/629 |
| 2012/0002395 A1 | 1/2012 | Du et al. | |
| 2015/0333472 A1 | 11/2015 | Demir et al. | |

OTHER PUBLICATIONS

A. Guermache et al: "New Design Rules and Experimental Study of Slightly Flared 1480 nm Pump Lasers", IEEE Photonics Technology Letters, 2006, 18 (6), pp. 782-784.

C.S. Harder et al, "High-power ridge-waveguide AlGaAs GRINSCH laser diode", Electron. Letters 1986, vol. 22, pp. 1081-1082.

N. Tsukiji et al, SPIE 2001, vol. 4532, pp. 349-360 Recent progress of high power 14xx nm pump lasers. SPIE ITcom on Active and Passive Optical Components for WDM Communication, Denver, Colorado.

* cited by examiner

BIDIRECTIONAL LONG CAVITY SEMICONDUCTOR LASER FOR IMPROVED POWER AND EFFICIENCY

RELATED APPLICATION

This application is a continuation of U.S. patent application Ser. No. 14/139,290, filed Dec. 23, 2013, which is incorporated herein by reference.

TECHNICAL FIELD

The present invention generally relates to semiconductor lasers, and more particularly relates to bidirectional long cavity semiconductor lasers that emit laser light from two low-reflectivity facets for providing higher overall output optical power and improved efficiency.

BACKGROUND OF THE INVENTION

Semiconductor lasers with high output optical power are of interest to many application, including but not limited to optical pumping of fiber and solid state lasers, frequency doubling, and material processing. FIG. 1 schematically shows, in top view, a typical high-power semiconductor laser, which has a high-reflectivity (HR) coated back facet (BF) 1 and anti-reflection (AR) coated front face (FF) 3 in order to concentrate all output optical power of the laser into a single output beam from the front facet 3.

Historically, increasing the cavity lengths L and, where multimode generation is acceptable, the width of the active region, was found to improve the laser output optical power due to better heat dissipation and reduced injection current density. However, the maximum output of conventional high power semiconductor lasers has been limited to rollover power levels of approximately 20 W for broad-area 100 um width lasers, and less for single-mode narrow-area lasers with the waveguide width of a few microns. Accordingly, for applications requiring even greater optical power, optical sources have been developed wherein radiation from multiple high-power lasers is combined in one or two output beams, see for example U.S. Pat. Nos. 8,427,749 and 8,437,086, both of which are assigned to the assignee of the present application and are incorporated herein by reference.

However, there is still a need to provide semiconductor lasers and semiconductor laser based devices with even greater output optical power and improved output efficiency.

SUMMARY OF THE INVENTION

The asymmetry of output reflectivity of the two facets of conventional high-power lasers was found to give rise to a strong longitudinal spatial hole burning (LSHB) that suppresses optical gain for the laser light at the output facet, increases the free-carrier optical absorption at the back facet of the lasers, and limits the maximum achievable output power for long-cavity lasers. These photon and carrier longitudinal inhomogeneities become more significant at higher currents, for longer cavities and with more asymmetric FF/BF coatings.

Accordingly, the present invention provides a bi-directional semiconductor laser having unfolded cavity with two AR-coated reduced-reflectivity facets for reducing LSHB related limitations on the maximum achievable power and the optimal laser length.

More particularly, one aspect of the present invention provides a long-cavity semiconductor laser device (SLD) for high-power applications, the SLD comprising a semiconductor laser chip which comprises first and second facets defining a laser cavity therebetween, and a laser waveguide extending between first and second facets and comprising an active layer for generating laser light, wherein the laser cavity is at least 5 mm long, and wherein each of the first and second facets comprises anti-reflection coating that is configured for reflecting back into the laser cavity between 0.1% and 10% of the laser light incident upon the respective facet, and for outputting at least 90% of the laser light incident thereupon. The SLD may comprise beam collimating optics for collimating the laser light emitted from the first and second facets into first and second collimated beams, and may further comprise beam combining optics for combining the laser light emitted from the first and second facets into a single output beam. The beam combining optics may include a polarization converter and a polarization beam combiner for combing the two collimated beams having orthogonal polarization states into one combined beam that may be substantially non-polarized.

A further aspect of the present invention relates to a light source comprising a plurality of the bi-directional SLDs disposed in a plurality of vertically offset levels for producing a first composite beam that is composed of vertically stacked first collimated beams emitted from the first facets of the plurality of the SLDs, and a second composite beam that is composed of vertically stacked second collimated beams emitted from the second facets of the plurality of the SLDs. The first and second collimated beams may then be polarization-combined into a single composite beam composed of vertically offset polarization-combined beams from the individual bi-directional SLDs.

BRIEF DESCRIPTION OF THE DRAWINGS

The invention will be described in greater detail with reference to the accompanying drawings which represent preferred embodiments thereof, in which like elements are indicated with like reference numerals, and wherein.

DETAILED DESCRIPTION

In the following description, for purposes of explanation and not limitation, specific details are set forth, such as particular optical devices and circuits, circuit components, techniques, etc. in order to provide a thorough understanding of the present invention. However, it will be apparent to one skilled in the art that the present invention may be practiced in other embodiments that depart from these specific details. In other instances, detailed descriptions of well-known methods, devices, and circuits are omitted so as not to obscure the description of the present invention.

While the present teachings are described in conjunction with various embodiments and examples, it is not intended that the present teachings be limited to such embodiments. On the contrary, the present teachings encompass various alternatives, modifications and equivalents, as will be appreciated by those of skill in the art. The terms "horizontal" and "vertical" as used herein are with respect to the main plane of the respective device, such as with respect to the plane of the substrate of a semiconductor laser, or with respect to a plane of the device support base. The terms "connect," "couple," "mount" and similar terms with their inflectional morphemes do not necessarily denote direct and immediate connections, but also include connections through mediate elements or devices. The terms "first", "second" and so forth are not intended to imply sequential ordering, but rather are intended to distinguish one element from another unless explicitly stated.

Figure 1:
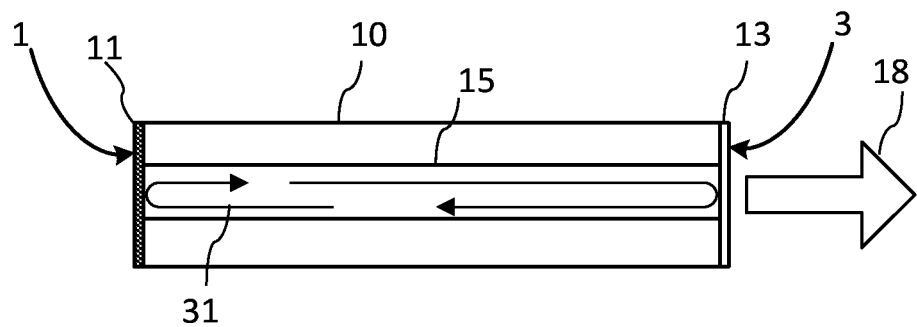
FIG. 1 is a simplified plan view of a conventional semiconductor laser for high-power applications having a single AR coated facet (1AR)

With reference to FIG. 1, a conventional high-power semiconductor laser (SL) 10 has a laser cavity that extends from the back facet (BF) 1 to the front facet (FF) 3 of the laser chip. The width of an active area of the laser is defined by the width of a laser waveguide 15, and may be on the order of a few microns (μm), 3-5 μm typically, for single lateral mode lasers, and may be tens or even hundreds microns for so called broad-area multi-mode devices. The back facet 1 of the SL 10 has an HR coating 11, which is typically configured so that it reflects back into the laser cavity about 99% or more of the laser radiation 31 that is generated within the laser cavity, i.e. its reflectivity $R_{BF}$ is about 99%. The front facet 3 has the AR coating 13 that is designed so as to suppress the natural Fresnel reflectivity of the laser facet and let almost all light 31 out of the laser cavity. Accordingly, SL 10 has a 'folded' cavity, which is also referred to herein as the '1AR' cavity, and is a substantially unidirectional device that emits light from only the front facet 3 of the laser chip. In practice, the front facet reflectivity $R_{FF}$ of conventional high-power lasers is typically about 1% or less and is optimized for maximum light output through FF 3, so that about 99% of the laser light 31 incident upon FF 3 escapes the laser cavity as the output light 18.

One disadvantage of the unidirectional cavity design is that it exacerbates the longitudinal spatial hole burning (LSHB) in the active region of the laser, which limits the maximum output power that may be achieved by increasing the cavity length of the laser. At very high optical power in longer cavity devices the photons in the optical mode deplete the electron-hole pairs toward the output side of the laser diode faster than the carriers can be injected, resulting in the LSHB. This causes strong decrease of carrier density and gain near the output facet FF 3, leading to reduction in photon density at FF 3 and hence a lower output power. Furthermore, a carrier accumulation outside the active layer(s) of the laser at and near BF 1 of the cavity causes higher absorption losses at the BF 1.

Figure 2:
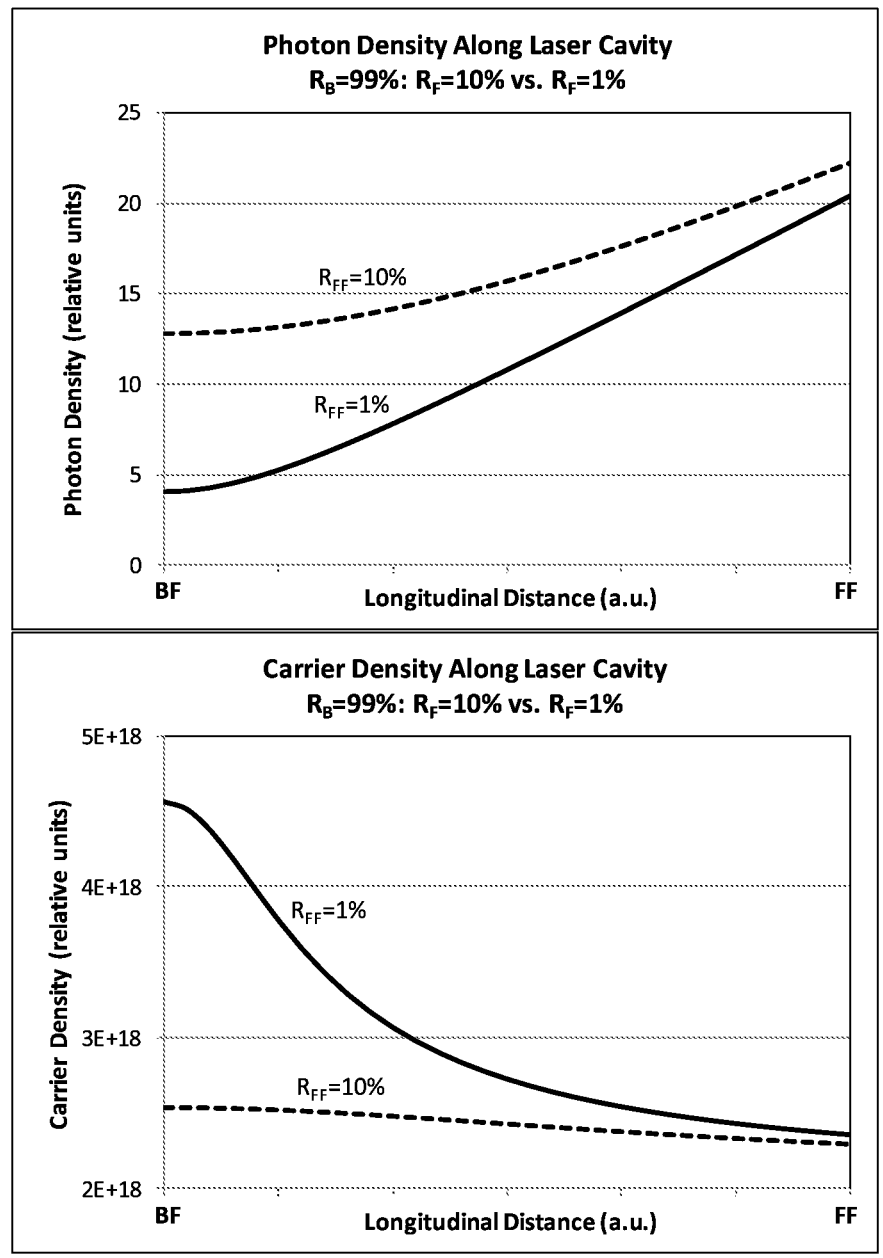
FIG. 2 is a graph illustrating simulated distributions of the photon density (top panel) and the carrier density in the active layer (lower panel) along the laser cavity of the conventional semiconductor laser of FIG. 1.
Figure 3:
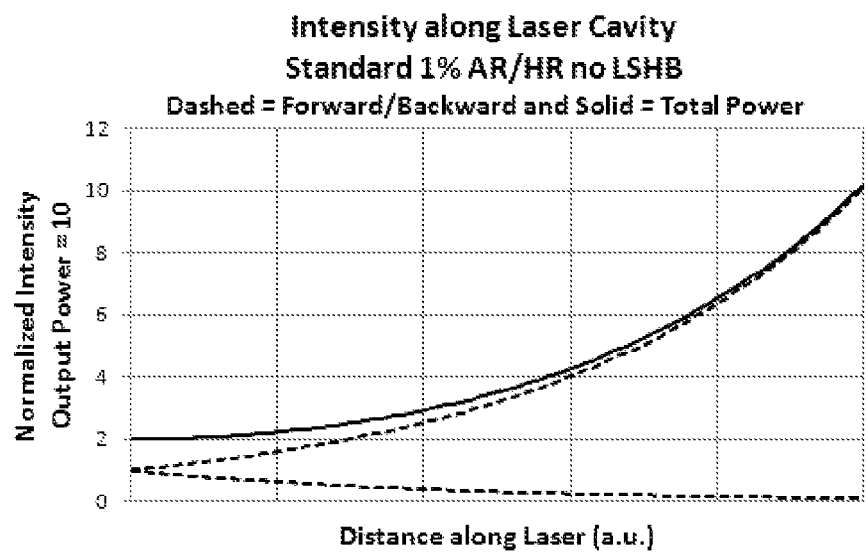
FIG. 3 is a graph illustrating simulated contributions of the forward and backward propagating waves into the total photon density distribution for the conventional semiconductor laser of FIG. 1 near laser threshold.
Figure 4:
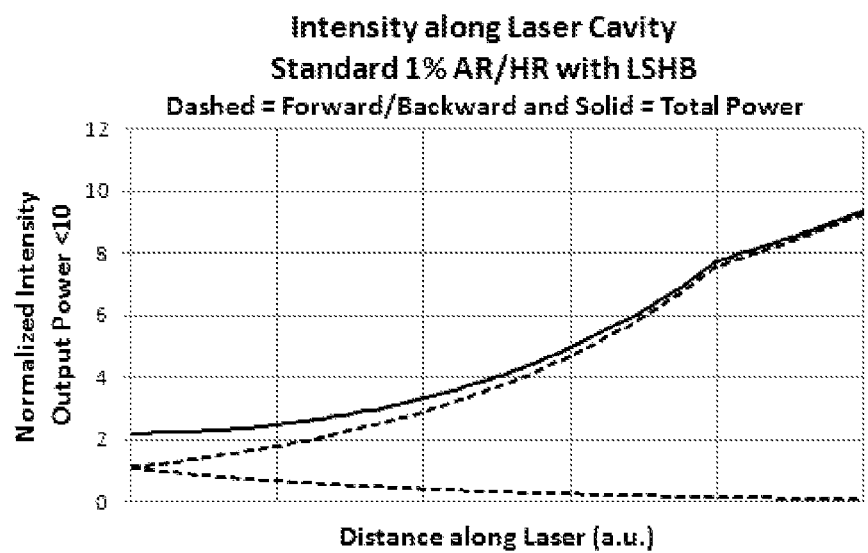
FIG. 4 is a graph illustrating simulated contributions of the forward and backward propagating waves into the total photon density distribution for the conventional semiconductor laser of FIG. 1 accounting for longitudinally-nonuniform optical gain saturation at a higher optical power.

The LSHB in a conventional unidirectional semiconductor laser with asymmetric facet coatings is illustrated in FIGS. 2-4, which show results of computer simulations of the photon and carrier density variations for a simplified model of a semiconductor laser with a BF reflectivity $R_{BF}$=0.99, or 99%, and two values of the FF reflectivity: $R_{FF}$=0.1 (10%) and 0.01 (1%).

Referring first to FIG. 2, the top panel shows a simulated distribution of the photon density along the laser cavity of SL 10, from the BF 1 (left) to the FF 3 (right), and the two values of the front facet reflectivity, 1% (solid line) and 10% (dashed line). The distribution of the total photon density along the cavity is highly asymmetric, with the photon density at the FF 3 much greater than at the BF 1. The asymmetry in the photon density distribution increases with the lowering of the FF reflectivity.

Continuing to refer to FIG. 2, the lower panel shows the corresponding carrier density distribution along the laser length for the two values, 1% and 10%, of the FF reflectivity. The photon density in the cavity is coupled to the carrier density through local optical gain, resulting in the LSHB in the laser cavity. As can be clearly seen, the LSHB-related non-uniformity of the carrier density along the laser cavity is pronounced for the 1% FF reflectivity, with the carrier concentration rising toward the back facet, while the carrier density stays relatively flat along the cavity with 10% FF reflectivity. The carrier density build-up at the BF 1 in lasers with 1% FF reflectivity increases the free carrier absorption of the laser light in the cavity and decreases the output power of the laser.

FIG. 3 shows, in addition to the simulated photon density distribution for FF reflectivity of 1% (solid curve), also separately the photon density of the forward and backward propagating waves within the laser cavity (dashed curves), with the lower dashed curve showing the contribution of the back propagating wave, i.e. from the FF to the BF. The photon density within the cavity is normalized so that the output optical power is 10 (in arbitrary units, a.u.). In the absence of gain saturation, the intensity of the laser radiation increases exponentially when traveling from one facet to another within the cavity due to active region gain. The light intensity of the forward propagating wave drops upon reflection at the FF 3 by 99%, as most of the forward propagating wave exits the laser resonator at the FF 3, and only 1% of it is reflected back into the laser cavity as the back propagating wave. The back-propagating photons then travel the cavity length L twice, with the total photon travel distance 2 L in the 'folded' cavity of SL 10, before leaving the cavity through FF 3.

The simulation results shown in FIG. 3 correspond to a relatively low-power regime, when the gain saturation by stimulated emission is relatively weak. In contrast, FIG. 4 schematically illustrates the effect of the gain saturation due to the LSHB on the output optical power, assuming that the local optical gain in the laser cavity drops when the photon density exceed 8 a.u. At a higher power, the optical gain near the output facet 3 is suppressed due to the lack of carriers, so that the normalized output power drops from 10 a.u. to 9 a.u. in this simple illustrative example.

Thus, the strong asymmetry in the facet reflectivity of conventional uni-directional high-power lasers results in a decreased laser efficiency and reduced optical output due to a disbalance in the photon and carrier distributions within the laser cavity, i.e. the carrier depletion and suppression of the optical gain at the FF, where the photon density is high, and the additional optical loss due the increased free carrier absorption at the highly-reflective BF. The detrimental effects on the laser efficiency of both these factors become more pronounced at higher injection levels and with increasing the laser length L. The asymmetry of the photon and carrier density distributions can be reduced by increasing the FF reflectivity from the currently preferred in the prior art 1% to, e.g. 10%, but such an increase in the FF reflectivity by itself would reduce the light output efficiency from the FF of the laser.

The present disclosure provides a solution to this problem by eliminating the HR coating of the BF 1 and replacing it with an AR coating that reduces, instead of increasing, the back facet reflectivity below its 'natural' Fresnel value determined by the refractive index discontinuity at the laser chip-air boundary. Advantageously, the replacement of the HR coating of the BF with the AR coating enables to weaken the detrimental effects of the LSHB on the laser output efficiency and maximum power by making the laser resonator more symmetrical, which reduces the disbalance in carrier and photon distributions and their build-ups at the opposing facets.

Figure 5:
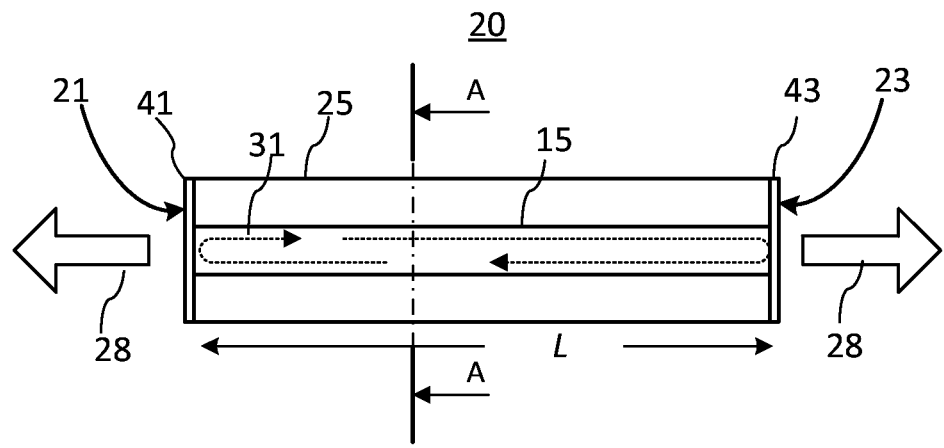
FIG. 5 is a simplified plan view of a bi-directional semiconductor laser according to an embodiment of the present invention having two AR coated facet (2AR)

With reference to FIG. 5, there is schematically illustrated SL 20 that employs an 'unfolded' bidirectional laser cavity according to an embodiment of the present invention. Similarly to SL 10, it includes a laser waveguide 15 that extends between two opposing facets 21, 23 of the laser chip 25, which are generally orthogonal to the waveguide 15 and serve as end-mirrors that define the laser cavity of SL 20. In contrast with SL 10, both facets 21 and 23 of the laser chip are AR-coated with AR coatings 41 and 43, and are referred to herein as the first and second facets, respectively. Accordingly, the laser cavity configuration of SL 20 will also be referred to herein as the 2AR cavity, and the SL 20 as the 2AR laser. The AR coatings 41, 43 are generally designed so that the reflectivity of each of the facets 21, 23 is in the range of 0.1% to 10%, and preferably in the range of 0.3% to 10% in embodiments absent of external cavity; techniques for designing and implementing such coatings for SL chips are well known in the art and will not be described herein. In one currently preferred embodiment these reflectivities are approximately equal to each other to provide a symmetrical laser cavity, but may also differ to some extent in other embodiments.

Figure 6:
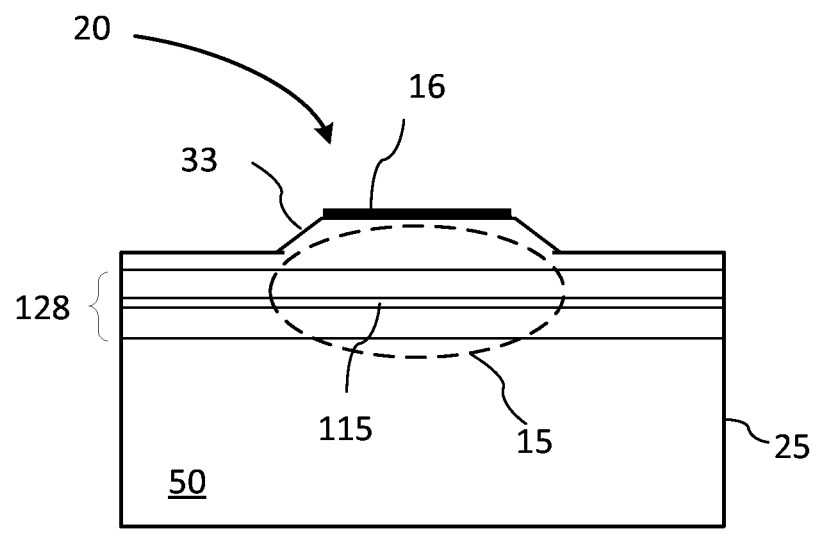
FIG. 6 is a cross-sectional view of an exemplary embodiment of the bi-directional semiconductor laser of FIG. 5.

FIG. 6 illustrates a cross-sectional view of SL 20 in one exemplary embodiment thereof, which corresponds to a cross-section A-A indicated in FIG. 5. In the shown exemplary embodiment, SL 20 includes a shallow ridge structure 33 that extends between facets 21, 23 and forms the optical waveguide 15, with a stripe contact 16 disposed on top of the ridge. The waveguide 15 incorporates a waveguiding layer structure 128 disposed over a substrate 50, with an active layer 115 that may include one or more quantum wells (QW) as known in the art. The ridge 33 provides an optical continent in the lateral direction and guides the laser light 31 generated in the active layer 115 to one of the facets 21, 41. The term 'lateral direction' is conventionally used in the art of semiconductor lasers and refers to the direction that is parallel to the main substrate plane of the laser chip 25 and normal to the light propagation direction within the waveguide 15. In other embodiments, the ridge 33 may extend through one or more of the waveguiding layers 128 formed in or upon the semiconductor substrate 55. In yet other embodiments, the waveguide 15 may be of the buried-waveguide type wherein the ridge 33 is buried under additional layers of a lower-index material providing the lateral optical confinement of the spatial laser mode, as known in the art. In one embodiment, the waveguide 15 is dimensioned so that it is effectively single-mode in the lateral direction. By way of example, in this embodiment the width of the ridge can be in the range of 3 to 5 μm. In another embodiment, SL 20 may be a broad-area laser, with the effective width of the ridge 33 and/or the current injection contact 16 ranging from tens to hundreds microns, for example in the range of 80 to 200 microns, or in the order of 100 μm typically. Although less preferred for some applications, an embodiment wherein ridge 33 is absent and the lateral optical confinement in the waveguide 15 is defined entirely by the width of the current contact 16 and the lateral profile of the resulting optical gain and carrier distribution in the active region of the laser is also within the scope of the present invention. Generally, the material composition, layer structure and the lateral waveguiding structure of SL 20 may vary and may be as known in the art for conventional high-power laser diodes.

Turning back to FIG. 5, in the 'unfolded' 2AR cavity design of SL 20, in contrast with the conventional '1AR' cavity configuration of SL 10, most of the photons generated within the cavity travel the cavity at most once before exiting it through one of the facets, with the corresponding photon travel distance being ~L instead of ~2 L for SL 10. This reduces the photon and carrier density buildup at the facets for 2AR lasers of the same length as 1AR devices, which results in a more uniform gain along the cavity length, thereby limiting negative effects of LSHB on the laser efficiency.

Figure 7:
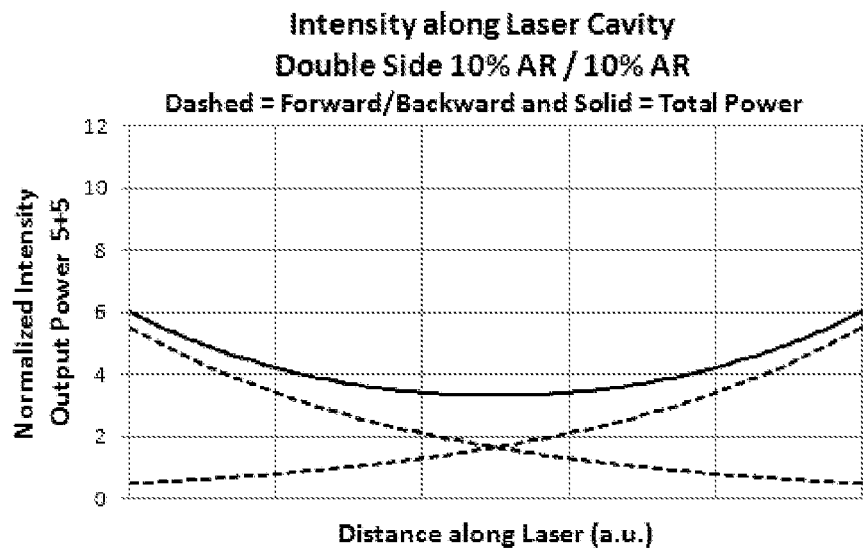
FIG. 7 is a graph illustrating simulated contributions of the forward and backward propagating waves into the total photon density distribution for the bidirectional semiconductor laser of FIG. 5.

Referring to FIG. 7, dashed curves illustrate simulated intensities of the 'forward' and 'backward' propagating waves in the 2AR cavity of SL 20, while the solid curve shows the resulting total photon density along the length of SL 20. These results were computed, using the same computer model as for FIGS. 2-4, for an exemplary case of 10% reflectivity of both laser facets, which is approximately equivalent to the 99%/1% BF/FF reflectivities of SL 10 in terms of the total output coupling efficiency. Comparing to the photon density distribution of FIG. 3, the unfolded cavity of SL 20 indeed results in a more uniform photon density profile along the cavity, and therefor considerably weaker LSHB.

Advantageously, the reduction in the LSHB makes it possible to increase the length of the laser chip well beyond optimal length of 1AR SLs, which is typically about 5 mm, without the laser performance becoming limited by the adverse effects of the LSHB. As a further advantage, the facets reflectivity may be decreased when laser length increases, which increases the out-coupling efficiency of the laser cavity, enabling an additional improvement in the output laser efficiency and/or maximum output power.

Figure 8:
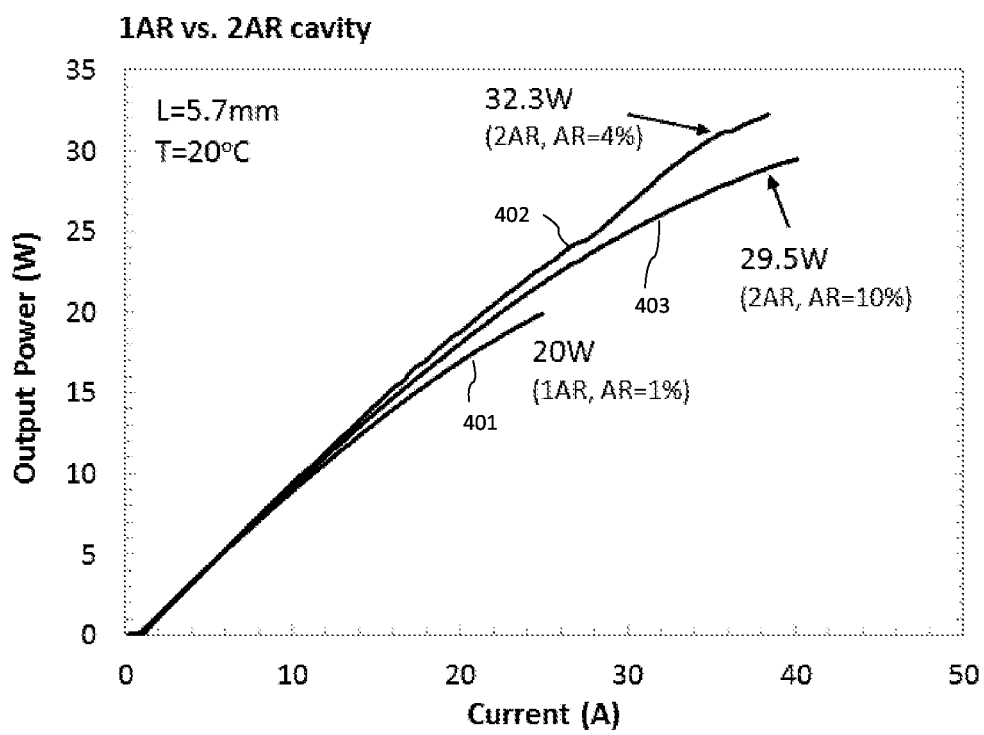
FIG. 8 is a graph showing measured output power vs. injection current characteristics of three semiconductor laser chips that differ only by their facet reflectivities: a conventional 1AR laser of FIG. 1 (401), a bi-directional 2AR laser (402) with 4% output reflectivity of both facets, and a bi-directional 2AR laser (403) with 10% output reflectivity of both facets.

Turning now to FIG. 8, the output power performance of two experimentally fabricated prototypes of the bidirectional (2AR) SL 20, which differ by their facets reflectivity, is shown in comparison to that of the conventional unidirectional, or 1AR, SL 10 for injection currents up to 40 A. All three lasers have the same length of 5.7 mm and substantially identical device structure, except for facet coatings. Curve 401 shows the FF output power P of the 1AR laser in dependence on the injection current J, while curves 402 and 403 show the P(J) dependencies for the 2AR devices with equal facet reflectivity of both facets of 4% (402) and 10% (403). The output power curves 402 and 403 show the total output power of the respective 2AR devices from both facets. The P(J) characteristic 401 of the standard 1AR SL exhibits an earlier "rollover" than those of the 2AR devices, and the 1AR device failed by COD (catastrophic optical damage) at the output power of about 20 W. The equivalent 2AR device with R=10% coating on both facets reached approximately 30 W of the output power without failure. For the second 2AR device, the AR coating of the facets was modified to reduce the facet reflectivity to 4%, which resulted in a yet higher total output power of about 32 W due to the enhanced outcoupling of the light generated within the cavity. Advantageously, the 2AR devices did not exhibit a complete P(J) rollover at the maximum power level. In these examples, the power improvement achieved in 2AR lasers, which we attribute at least in part to a reduction of LSHB, is about 50%.

Further investigations have shown that additional improvements in maximum output power and output efficiency can be achieved by further increasing the laser length L beyond 5 mm and by further decreasing the facet reflectivity in longer-cavity devices. Generally, facets reflectivity of useful 2AR lasers with cavity length of about 5 mm and above should preferably be in the range from 0.3% to 5% for good performance, with optimal values depending on the cavity length and, possibly, other device specifics such as waveguide width and strength and epitaxial layer structure. In one preferred embodiment, the facet reflectivity is in the range of 0.5% to 5%, for each facet, for devices with the laser cavity length L in the range from about 6 mm to 15 mm. In one exemplary embodiment, an optimal facet reflectivity is about 1% to 3% and the laser length is about 8 to 10 mm.

Figure 9:
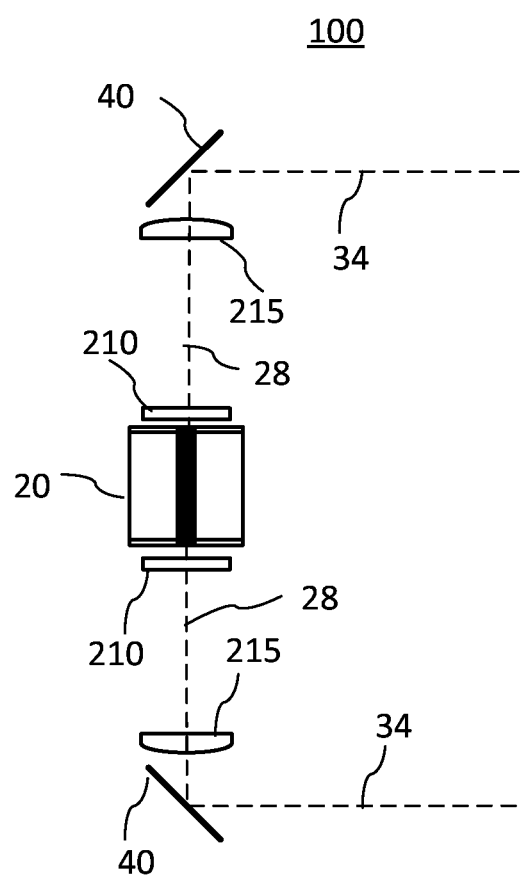
FIG. 9 is a schematic block diagram of a bi-directional laser source for emitting two parallel collimated beams.

Referring now to FIG. 9, there is illustrated an exemplary laser arrangement 100 that is based on SL 20 and additionally includes optics for collimating the laser output beams 28 from the two facets and optionally re-directing these beams to propagate in a same direction, as may be useful in applications. This optics includes two sets of beam collimating optics 210, 215, one for each facet, and two reflectors 40.

Light emitted from a high power SL is typically highly asymmetric due to a thin-slab geometry of their active regions and waveguides, resulting in long and thin emitting apertures at the laser facets. The light beam emitted by such lasers can be described in term of its 'fast axis' and 'slow axis'; it has a much higher brightness and divergence in the direction of its "fast axis", which is perpendicular to the active layer of the laser, than in the direction of its "slow axis", which is parallel to the active layer. In FIG. 9, the active layer of SL 20, the long axis of its output aperture, and the slow axis of the laser beams 28 are all parallel to the plane of the figure, while the fast axis of the laser beam is normal to the plane of the figure.

Accordingly, in the shown embodiment the beam collimating optics for each of the laser beams 28 includes a fast axis collimator (FAC) 210, which is preferably located in a close proximity to the respective facet, for collimating the laser beams 28 in the fast axis plane, and a slow axis collimator (SAC) 215 for collimating the laser beams 28 in the slow axis plane. The term "fast axis plane" as used herein refers to a plane defined by the fast axis of a beam and the beam's propagation direction, and the term "slow axis plane" refers to a plane defined by the slow axis of a beam and the beam's propagation direction. With respect to FIG. 9, the slow axis plane is parallel to the plane of the figure, and the fast axis plane is orthogonal to the plane of the figure.

The FACs 210 can be, for example, in the form of optical lenses that are cylindrical, or, more generally, toroidal in shape, such that while the divergence of beam 28 in the fast axis plane is minimized or at least substantially reduced so that the beams 28 are collimated in their respective fast axis planes after the FACs 210, the divergence of beams 28 in the slow axis plane is nearly unaffected or affected to a lesser degree. SACs 215 may be disposed further away from SL 20, either before or after the reflectors 40, and may each be in the form of a cylindrical or toroidal lens as known in the art. The function of SACs 215 is to collimate the beams 28 such that after SACs 215 the beams 28 are collimated in both the slow axis plane and the fast axis plane. The distance between each SAC 215 and the corresponding facet may be selected so as to provide the beam 28 with a desired aspect ratio. In other embodiments SAC 215 and FAC 210 disposed in the optical path of the same beam 28 may be embodied using a single lens element of a suitable shape that is selected so as to collimate the laser beam 28 in both the fast and slow axis planes.

The reflectors 40 are beam turning elements that are disposed in the optical path of the respective laser beams 28 so as to direct said beams in a same general direction in parallel. Each of the reflectors 40 may be embodied as a flat mirror or other beam-deflecting device, such as but not limited to an optical prism or a diffraction grating. It will be appreciated that there are more than one way to position reflectors 40 to direct beams 28 in the same general direction, and FIG. 9 shows just one exemplary positioning of these reflectors. For example, both reflectors can be sequentially positioned in the optical path of the same beam 28, turning it by 180°.

Figure 10:
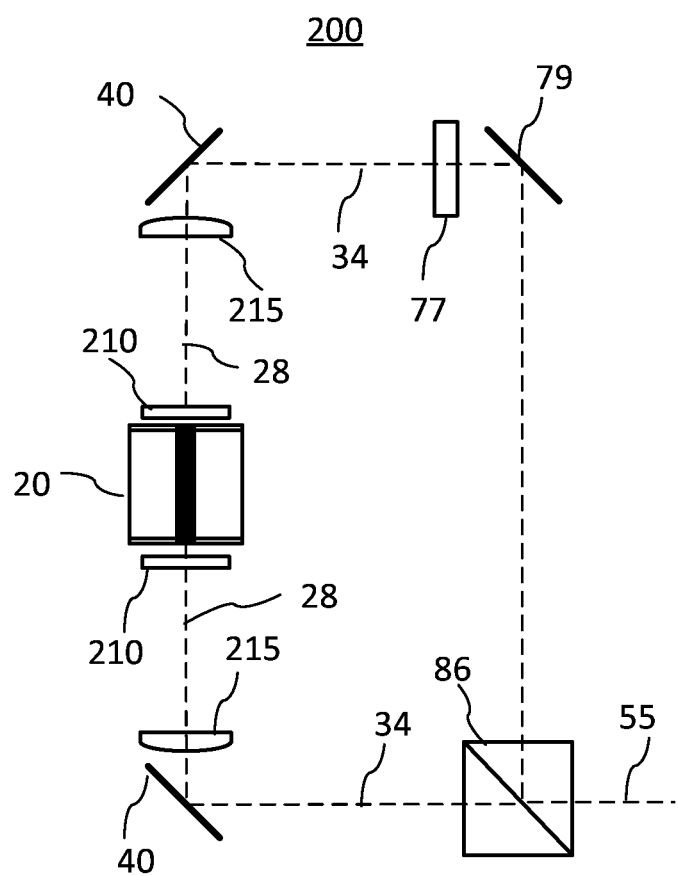
FIG. 10 is a schematic block diagram of a semiconductor laser device wherein light from both facets of a bi-directional lasers is combined into a single collimated beam.

Referring now to FIG. 10, there is illustrated an exemplary embodiment of a laser source 200 that includes the laser arrangement 100 and additionally includes optics for combining the collimated laser output beams 28 from the two facets into a single output beam 55. This additional optics includes a third beam reflector 79, a polarization converter 77, and a polarization beam combiner (PBC) 86. The PBC 86 is disposed in the optical path of one of the collimated beams 28, and the reflector 79 is a beam turning elements that is disposed in the optical path of the other of the laser beams 28 so as to direct said beam towards the polarization beam combiner 86 for combining it with the laser beam 28 from the other laser facet into a single output beam 55. The reflector 79 may be embodied as a flat mirror or other beam-deflecting device, such as but not limited to an optical prism or a diffraction grating. The polarization converter 77 may be disposed in the optical path of any of the beams 28 to convert its polarization state to an orthogonal one.

Figure 11:
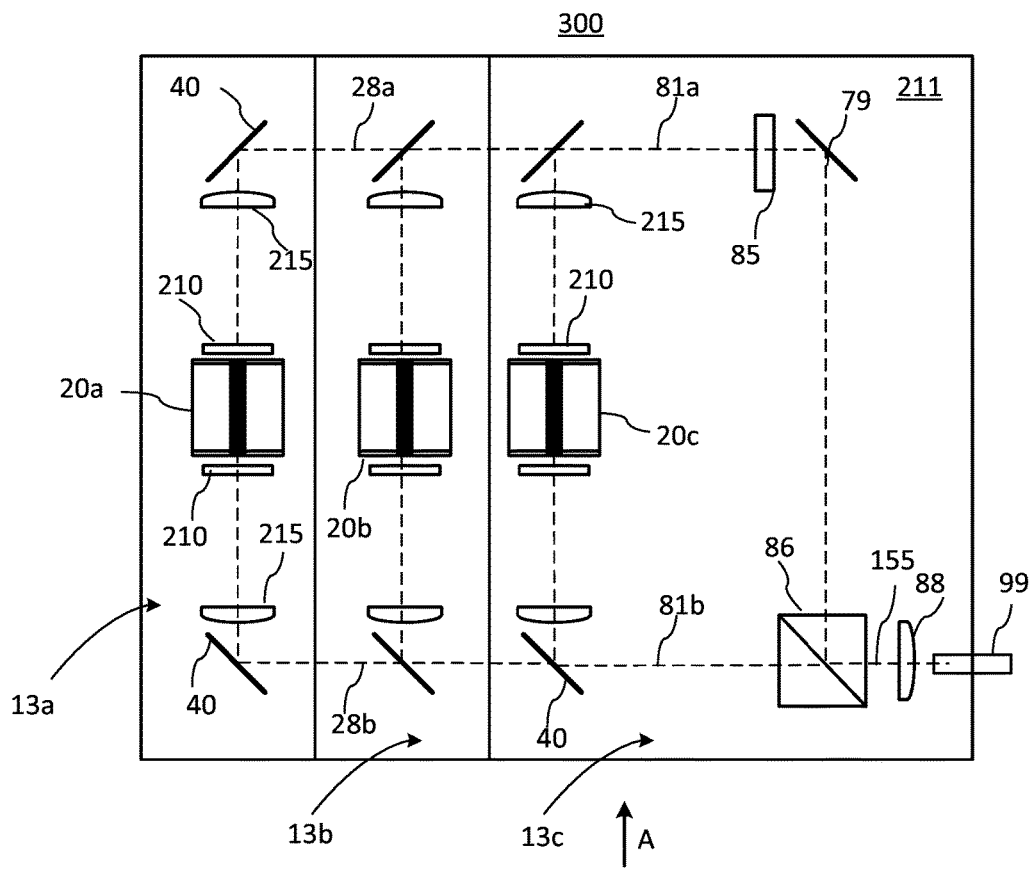
FIG. 11 is a schematic block diagram of a semiconductor laser device wherein light from both facets of multiple bi-directional lasers is combined into a single polarization-combined composite output beam.
Figure 12:
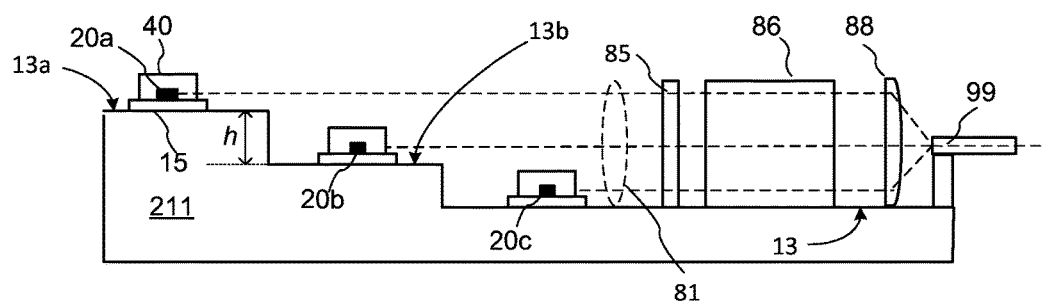
FIG. 12 is a side view of the semiconductor laser device of FIG. 11.

Turning now to FIGS. 11 and 12, there is illustrated, in plane and side views respectively, another embodiment of the semiconductor laser device (SLD) of the present disclosure in the form of an apparatus 300, which combines light collected from both facets of a plurality of N bidirectional SLs 20 into a composite light beam 155 suitable for coupling into an optical fiber. FIG. 11 illustrates the plane view of the SLD 300, while FIG. 12 shows the side view thereof taken in the direction of arrow 'A' shown in FIG. 11.

In this embodiment, the apparatus 300 may be viewed as N bidirectional laser arrangements 100 of FIG. 9 that are disposed in a plurality of vertically offset levels so as to produce a first composite beam 81a that is composed of vertically stacked first collimated beams 28a emitted from the first facets of the plurality of the SLs 20, and a second composite beam 81b that is composed of vertically stacked second collimated beams 28b emitted from the second facets of the plurality of the SLs 20. SDL 300 is a modification of the beam combining light source that is disclosed in U.S. Pat. Nos. 8,427,749 and 8,437,086, which are incorporated herein by reference, except that it replaces pairs of co-planar uni-directional lasers disposed in a same level with a single bi-directional SL 20.

In the shown exemplary embodiment N=3, so that the apparatus 300 is comprised of three instances of the bidirectional SL 20, namely SL 20a, SL 20b, and SL 20c, which are mounted upon different "steps" 13a-13c of a stepped support base 211. Each SL 20 is provided with beam collimating and turning optics 210, 215, 40 for each facet thereof, as described hereinabove with reference to FIG. 9, with steps 13a-13c having a non-zero height h that preferably exceeds the vertical dimension of the collimated beams 28a,b from individual SLs 20. In one embodiment, each of the steps has a single one of the SLs 20 mounted thereon with the planes of slow axes thereof being parallel to the mounting surface.

Figure 13:
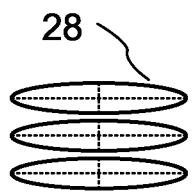
FIG. 13 is a schematic cross-sectional view of a composite beam produced in the semiconductor laser device of FIGS. 11 and 12.

The reflectors 40 align beams 28a,b emitted from similarly-oriented facets of SLs 20 in the plane of the support base 211 to form two composite laser beams 81a and 81b, as illustrated in FIGS. 11 and 12 with dashed lines. Each of the first and second composite beams 81a, 81b is composed of the first (28a) or second (28b) collimated beams, respectively, that are stacked in a direction of the fast axes thereof, as illustrated in FIG. 13. Thus, each of the composite laser beams 81a,b is composed of N vertically stacked collimated SL beams 28a or 28b emitted from SL facets facing the same direction, with N=3 in FIGS. 11-13. The composite beams 81a and 81b are then combined using the PBC 86, the turning mirror 79, and the polarization converter 85 to form a polarization-combined output composite beam 155, which is composed of N vertically stacked collimated beams from individual SLs 20, each of which in turn composed of overlapping and polarization-combined beams 28a or 28b emitted from both facets of the same SL 20. The polarization-combined output composite beam 155 may then be coupled into an optical fiber 99 using a coupling optics 88, such as a suitable coupling lens, for example convex-convex or convex-plane, or an anamorphic telescope as known in the art.

Figure 14:
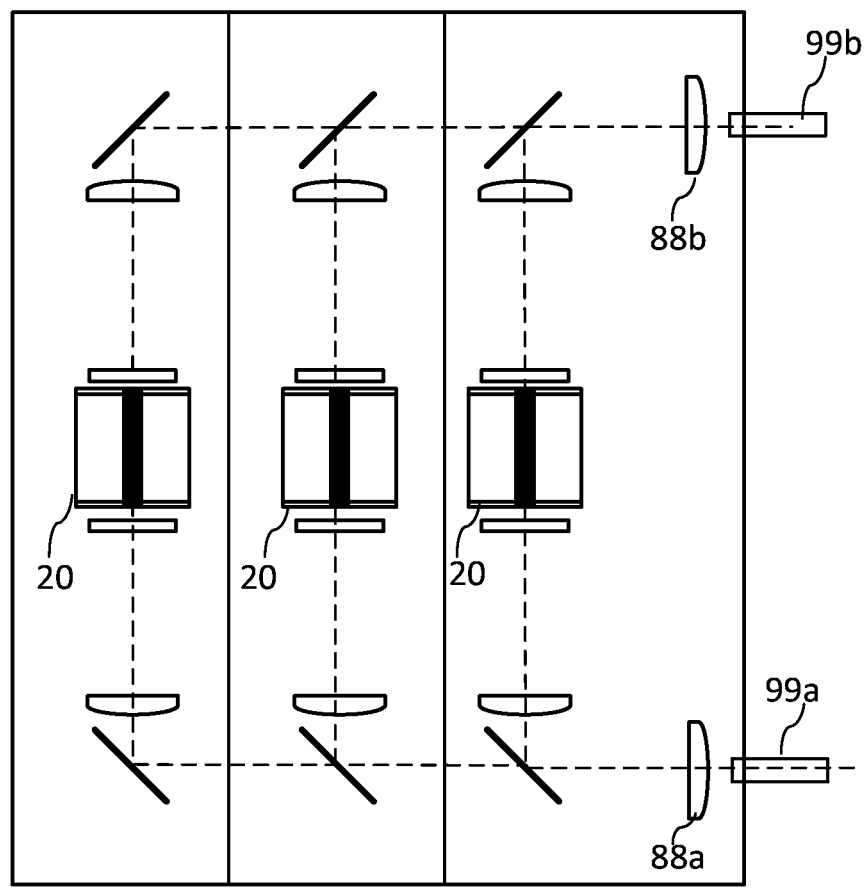
FIG. 14 is a schematic block diagram of a semiconductor laser device wherein light from both facets of multiple bi-directional lasers is combined into two collimated composite output beams.

Referring now to FIG. 14, in another embodiment the polarization converter 85, PBC 86 and the turning mirror 79 of SLD 300 may be omitted, and instead the two composite beams 81 may be coupled into two output fiber ports 99a and 99b using coupling optics 88a and 88b, so as to provide a high-power optical source with two output beams, each composed of a plurality of parallel vertically offset and horizontally aligned collimated optical beams.

Advantageously, SLD 300 and SLD 400 require significantly fewer individual lasers to provide the same optical power in the output fiber 99 as the multi-laser optical sources disclosed in U.S. Pat. Nos. 8,427,749 and 8,437,086, thereby simplifying optical alignment and reducing the cost of the device per unit of output power.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

We claim:

1. A semiconductor laser device comprising:
 a semiconductor laser chip comprising:
   a first facet and a second facet defining a laser cavity therebetween; and
   a laser waveguide, extending between the first facet and the second facet, comprising an active layer for generating laser light, wherein
   the first facet includes an anti-reflection coating that is configured for reflecting back into the laser cavity a first portion of the laser light and for outputting a second portion of the laser light,
   the second facet includes an anti-reflection coating that is configured for reflecting back into the laser cavity a third portion of the laser light and for outputting a fourth portion of the laser light,
   the second portion and the fourth portion are combined outside the laser cavity,
   and
   a buildup of a carrier density near the first facet and the second facet is reduced, thereby providing for greater gain uniformity along the laser cavity.

2. The semiconductor laser device of claim 1, wherein at least 90% of the laser light travels the laser cavity one time before exiting through the first facet or the second facet.

3. The semiconductor laser device of claim 1, further comprising:
 a ridge that extends between the first facet and the second facet.

4. The semiconductor laser device of claim 1, wherein the laser waveguide has a width in a range of:
 3 to 5 microns, or
 80 to 200 microns.

5. The semiconductor laser device of claim 1, wherein the laser cavity is at least 5 mm long.

6. The semiconductor laser device of claim 1, further comprising:
 first beam collimating optics for collimating laser light, emitted from the first facet, into a first collimated beam; and
 second beam collimating optics for collimating laser light, emitted from the second facet, into a second collimated beam.

7. The semiconductor laser device of claim 6, further comprising:
 a first reflector for reflecting the first collimated beam; and
 a second reflector for reflecting the second collimated beam.

8. The semiconductor laser device of claim 7, further comprising:

a beam combiner for combining the reflected, first collimated beam and the reflected, second collimated beam into a single output beam.

9. An apparatus comprising:

a plurality of semiconductor laser devices, wherein each semiconductor laser device, of the plurality of semiconductor laser devices, includes a semiconductor laser chip including:

a first facet and a second facet defining a laser cavity therebetween; and a laser waveguide, extending between the first facet and the second facet, comprising an active layer for generating laser light, wherein the first facet includes an anti-reflection coating that is configured for reflecting back into the laser cavity a first portion of the laser light and for outputting a second portion of the laser light, the second facet includes an anti-reflection coating that is configured for reflecting back into the laser cavity a third portion of the laser light and for outputting a fourth portion of the laser light, the second portion and the fourth portion are combined outside the laser cavity, a buildup of a carrier density near the first facet and the second facet is reduced, thereby providing for greater gain uniformity along the laser cavity.

10. The apparatus of claim 9, wherein at least 90% of the laser light travels the laser cavity one time before exiting through the first facet or the second facet.

11. The apparatus of claim 9, wherein the laser cavity is at least 5 mm long.

12. The apparatus of claim 9, further comprising:

first beam collimating optics for collimating laser light, emitted from the first facet of each of the plurality of semiconductor laser devices, into a first collimated beam; and second beam collimating optics for collimating laser light, emitted from the second facet of each of the plurality of semiconductor laser devices, into a second collimated beam.

13. The apparatus of claim 12, further comprising:

a first reflector for reflecting the first collimated beam; and a second reflector for reflecting the second collimated beam.

14. The apparatus of claim 13, further comprising:

a beam combiner for combining the reflected, first collimated beam and the reflected, second collimated beam into a single output beam.

15. A method comprising:

generating, using an active layer, laser light, wherein the active layer is located within a laser waveguide of a semiconductor laser chip that includes a first facet and a second facet defining an unfolded a laser cavity therebetween, the laser waveguide extends between the first facet and the second facet, and the first facet and the second facet each include an anti-reflection coating;

reflecting, using the first facet, a first portion of the laser light;

outputting, using the first facet and the second facet, a second portion of the laser light;

reflecting, using the second facet, a third portion of the laser light; and outputting, using the second facet, a fourth portion of the laser light, combining the second portion and the fourth portion outside the laser cavity, wherein a buildup of a carrier density near the first facet and the second facet is reduced, thereby providing for greater gain uniformity along the laser cavity.

16. The method of claim 15, wherein at least 90% of the laser light travels the laser cavity one time before exiting through the first facet or the second facet.

17. The method of claim 15, wherein the laser waveguide has a width in a range of:

3 to 5 microns, or 80 to 200 microns.

18. The method of claim 15, wherein the laser cavity is at least 5 mm long.

19. The method of claim 15, further comprising:

collimating, using first beam collimating optics, laser light, emitted from the first facet, into a first collimated beam; and collimating, using second beam collimating optics, laser light, emitted from the second facet, into a second collimated beam.

20. The method of claim 19, further comprising:

combining, using a beam combiner, the first collimated beam and the second collimated beam into a single output beam.

* * * * *